(12) United States Patent
Walters, Jr. et al.

(10) Patent No.: US 7,029,266 B2
(45) Date of Patent: Apr. 18, 2006

(54) METHODS AND APPARATUSES FOR SHAPING A PRINTED CIRCUIT BOARD

(75) Inventors: Paul R. Walters, Jr., Meridian, ID (US); Refugio C. Morales, Jr., Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 359 days.

(21) Appl. No.: 10/430,612

(22) Filed: May 5, 2003

(65) Prior Publication Data
US 2004/0222563 A1 Nov. 11, 2004

(51) Int. Cl.
*B29C 59/04* (2006.01)
(52) U.S. Cl. .................. 425/343; 425/366; 425/374
(58) Field of Classification Search ............... 425/335, 425/343, 366, 374
See application file for complete search history.

(56) References Cited

U.S. PATENT DOCUMENTS

| | | | |
|---|---|---|---|
| 3,213,510 A * | 10/1965 | Mizer et al. ............. | 425/366 |
| 3,344,900 A | 10/1967 | Drop | |
| 3,603,646 A | 9/1971 | Leoff | |
| 3,802,559 A | 4/1974 | Luchetti | |
| 4,398,457 A | 8/1983 | Takahashi et al. | |
| 4,495,132 A * | 1/1985 | Johnson ............. | 425/403.1 |
| 4,687,267 A | 8/1987 | Header et al. | |
| 4,702,163 A | 10/1987 | Araki et al. | |
| 4,981,074 A | 1/1991 | Machita et al. | |
| 5,117,963 A | 6/1992 | Thayer et al. | |
| 5,134,932 A | 8/1992 | Fujino | |
| 5,226,361 A | 7/1993 | Grant et al. | |
| 6,331,105 B1 * | 12/2001 | Lee ............. | 425/366 |
| 6,368,540 B1 | 4/2002 | Morales | |

FOREIGN PATENT DOCUMENTS

JP 62082032 A 4/1987

OTHER PUBLICATIONS

Radoll's Gold Finger Beveling Products, Radoll Designs, Inc., 2 pages, retrieved from the Internet on Jul. 7, 1999.

* cited by examiner

*Primary Examiner*—James P. Mackey
(74) *Attorney, Agent, or Firm*—Perkins Coie LLP

(57) ABSTRACT

Methods and apparatuses for shaping a corner of a printed circuit board are disclosed. An apparatus in accordance with one embodiment includes a carrier configured to releasably contact a printed circuit board, a curved contact surface positioned to roll against a corner of the printed circuit board. Optionally, another curved contact surface can be positioned to roll against another corner of the printed circuit board. The contact surface can be rotatable relative to the carrier about a rotation axis that is generally parallel to at least a portion of the curved contact surface. The contact surface can be continuous or discontinuous, and can shape the corner of the printed circuit board with a reduced tendency for damage to the printed circuit board. Multiple contact surfaces can be rotatable about different rotation axes.

26 Claims, 6 Drawing Sheets

METHODS AND APPARATUSES FOR SHAPING A PRINTED CIRCUIT BOARD

TECHNICAL FIELD

The present application is directed toward methods and apparatuses for shaping printed circuit boards.

BACKGROUND

Printed circuit boards (PCBs) are used widely in the computer industry to support microelectronic devices for removable, electrical coupling to other components. For example, computer motherboards typically include expansion slots or sockets configured to receive a PCB that in turn carries microelectronic devices, such as memory chips. The memory capacity of the computer can be selectively enhanced by coupling the PCB (and, therefore, the memory chips it carries) to the expansion slot. Accordingly, the PCB typically includes electrical PCB contacts that are electrically connected to the microelectronic devices and that releasably connect to corresponding socket contacts when the PCB is inserted into the socket.

One drawback with PCBs is that they can become damaged as they are inserted into the corresponding sockets. For example, the plies or layers of material forming a PCB can peel away from each other if the PCB is not precisely aligned with the socket during insertion. One method for addressing this drawback has been to bevel the leading edge of the PCB to ease the entry of the PCB into the socket. For example, the corners at the leading edge of the PCB can be trimmed with sharp blades, or milled to have sloped profiles that slide more easily into the corresponding sockets.

One drawback with the foregoing beveling approaches has been that they can create undesirable debris and can waste valuable conductive materials of the PCB. U.S. Pat. No. 6,368,540 to Morales, assigned to the assignee of the present application and incorporated herein by reference, addresses this drawback. For example, Morales discloses rolling a wheel along the corners of the PCB rather than removing material from the corners. The wheel deforms the initially sharp corners into beveled surfaces. In a particular embodiment, the corners of the PCB can be beveled by a wheel having a circumferentially extending, V-shaped slot with angled surfaces corresponding to the desired bevel angle for the corners of the PCB. While this approach has been successful for beveling the corners of the PCB without removing material from the corners, the contact between the PCB and the surfaces of the wheel can in some cases create undesirable forces on the PCB.

DETAILED DESCRIPTION

A. Introduction

Figure 1:
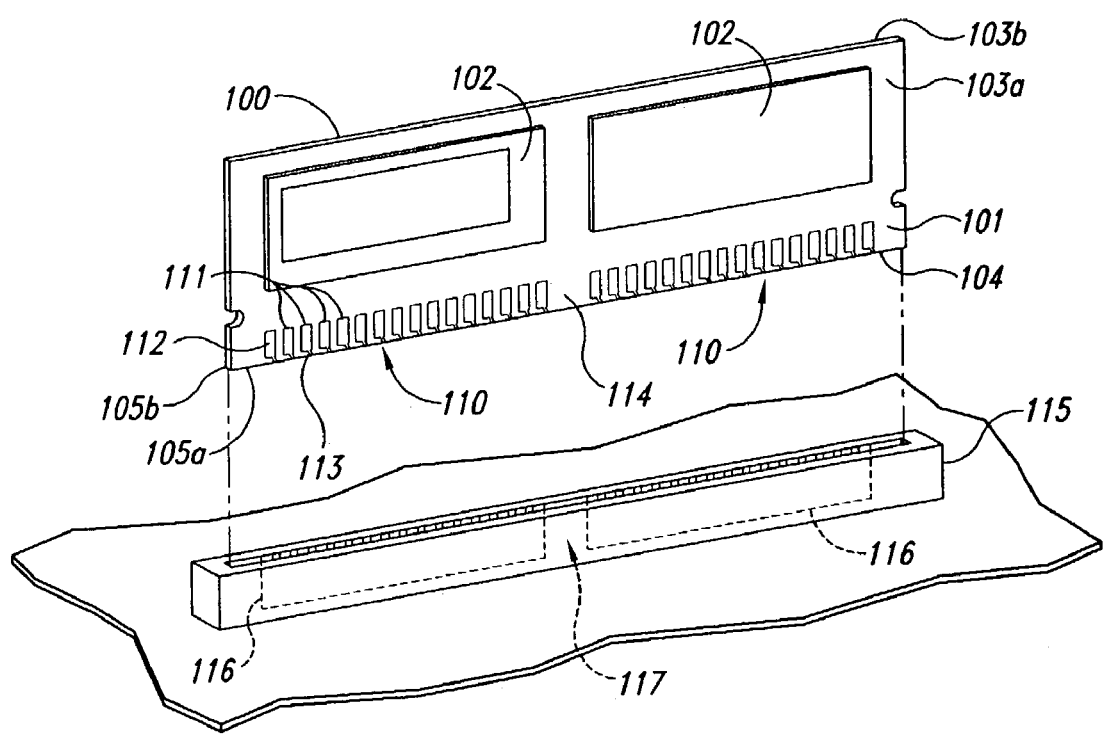
FIG. 1 is a partially schematic, isometric illustration of a PCB prior to being shaped in accordance with an embodiment of the invention.

The present invention is directed toward methods and apparatuses for shaping printed circuit boards (PCBs). Several specific details of the invention are set forth in the following description and in FIGS. 1–6B to provide a thorough understanding of certain embodiments of the invention. One skilled in the art, however, will understand that the present invention may have additional embodiments, and that other embodiments of the invention may be practiced without several of the specific features explained in the following description.

An apparatus in accordance with one aspect of the invention includes a carrier having at least one contact portion positioned to releasably contact a printed circuit board. At least one curved contact surface can be positioned at least proximate to the carrier and can be rotatable relative to the carrier about a rotation axis to roll against a corner of the printed circuit board when the carrier carries the printed circuit board. The rotation axis can be generally parallel to the curved contact surface. In a particular embodiment, another curved contact surface can be positioned at least proximate to the carrier and can be rotatable relative to the carrier about another rotation axis different than the first rotation axis. The other contact surface can be positioned to roll against another corner of the printed circuit board when the carrier carries the printed circuit board. Accordingly, the contact surface(s) can bevel or otherwise shape the corner(s) of the printed circuit board.

In further aspects of the invention, the contact surface can form a portion of a roller, and the contact surface can be generally continuous or can have a discontinuity, for example, a recess. In still further aspects of the invention, first and second contact surfaces can form a contact surface pair, and at least one of the carrier and the contact surface pair can be movable relative to the other along a motion axis extending between the rotation axes about which the contact surfaces rotate.

A method for shaping a corner of a printed circuit board in accordance with another aspect of the invention includes positioning a corner of the printed circuit board against a curved contact surface. The method can further include changing a shape of the corner as at least one of the contact surface and the corner moves relative to the other while the contact surface rotates about a rotation axis, with the rotation axis being generally parallel to at least a portion of the curved contact surface. In a particular embodiment, another corner of the printed circuit board is positioned against another curved contact surface and a shape of the other corner is changed as at least one of the other contact surface and the other corner moves while the other contact surface rotates about another (different) rotation axis.

In further aspects of the invention, the printed circuit board can include a first face, a second face, and an intermediate surface between the first and second faces, with a first corner positioned between the first face and the intermediate surface, and with a second corner positioned between the second face and the intermediate surface. The method can further include aligning a first rotation axis of a first curved surface at about 30 degrees relative to the first face, and aligning a second rotation axis of a second curved surface at about 30 degrees relative to the second face.

B. Apparatuses and Methods in Accordance With Embodiments of the Invention

FIG. 1 is a partially schematic, isometric illustration of a PCB 100 suitable for being shaped in accordance with an embodiment of the invention. In one aspect of this embodiment, the PCB 100 can include a substrate 101 formed from sandwiched layers of conductive and nonconductive materials. Accordingly, the substrate 101 can have opposing faces 103 (shown in FIG. 1 as a first face 103a and a second face 103b behind the first face 103a). A downwardly facing intermediate surface 104 is positioned between the faces 103a, 103b to form two corners 105 (shown as a first corner 105a and a second corner 105b). The corners 105 can initially be generally sharp (as shown in FIG. 1) and can subsequently be beveled using methods and apparatuses in accordance with embodiments of the invention.

In one embodiment, the first and second faces 103a, 103b can each carry devices 102, such as memory chips, processors, or other microelectronic devices. The devices 102 are electrically connected to contact arrays 110 with traces (not visible in FIG. 1) positioned at or below the surfaces of the faces 103. Each contact array 110 can include a conductive material 112 (such as gold) formed into a plurality of contacts 111. Each contact 111 can include a tie bar 113 that extends to the first corner 105a. Accordingly, the tie bars 113 can provide electrical continuity with the contacts 111 during the plating operations typically used to form the contacts 111. In one aspect of this embodiment, the PCB 100 can include two contact arrays 110 separated by an intermediate, contactless portion 114. In other embodiments, the PCB 100 can include a single contact array 110 or more than two contact arrays 110. In any of these embodiments, the PCB 100 can be received in a socket 115 which can have corresponding contact receptacles 116. The contact receptacles 116 can include socket terminals or contacts (not visible in FIG. 1) that releasably, electrically connect with the PCB contacts 111.

Figure 2:
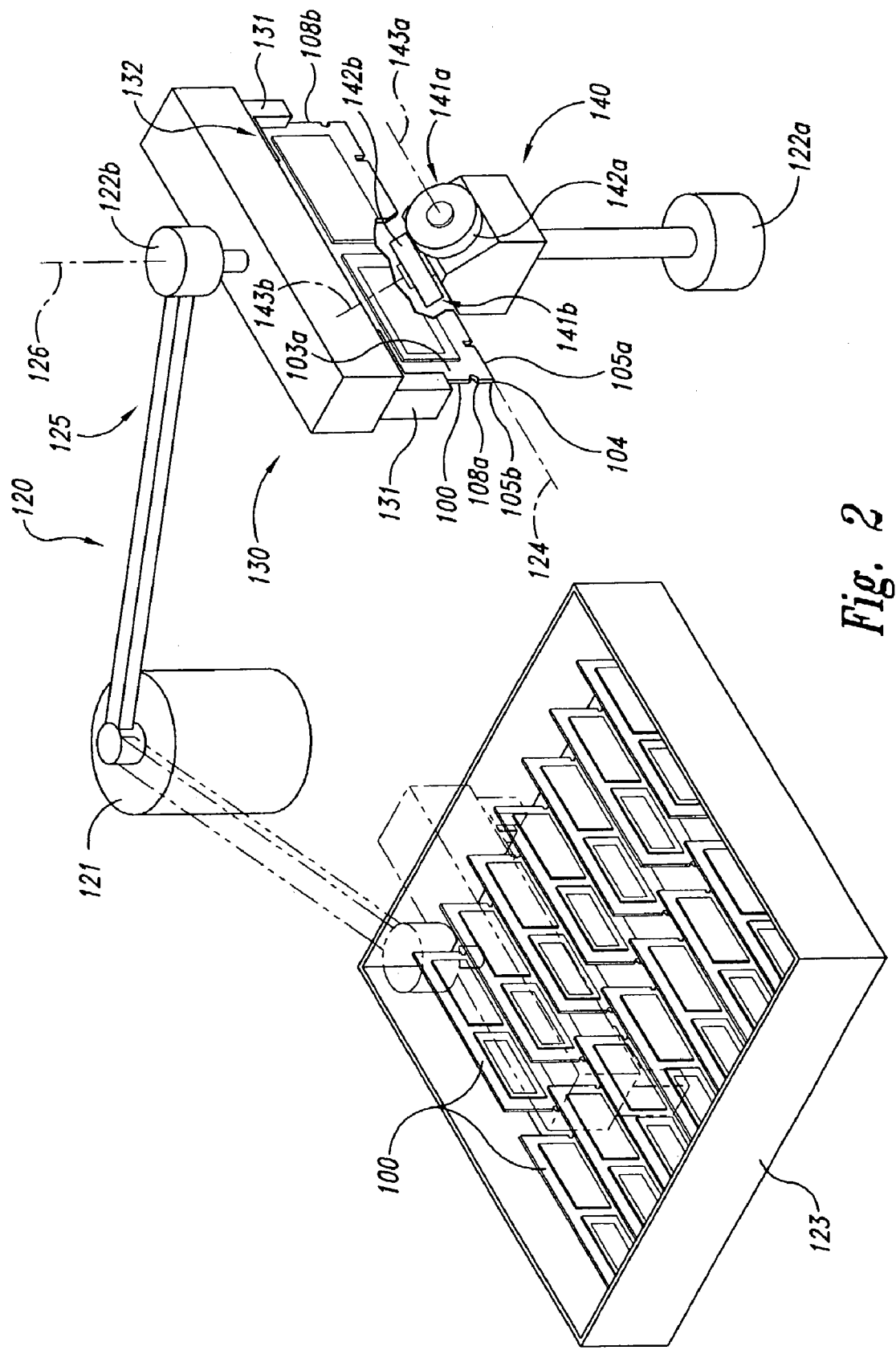
FIG. 2 is a partially schematic, isometric illustration of an apparatus for shaping PCBs in accordance with an embodiment of the invention.

FIG. 2 is a partially schematic, isometric illustration of an apparatus 120 configured to shape the corners 105 of a PCB 100 (for example, the PCB 100 described above with reference to FIG. 1). For purposes of illustration, a portion of the PCB 100 is shown broken away in FIG. 2. In one embodiment, the apparatus 120 can include a carrier 130 configured to releasably carry the PCB 100 so that the corners 105 bear against two contact surfaces 142 (shown as a first contact surface 142a and a second contact surface 142b). Each contact surface 142 can rotate about a different axis while the contact surfaces 142 pass into and out of contact with the PCB 100, as described in greater detail below.

In one embodiment, the contact surfaces 142 can form a contact surface pair, and each contact surface 142 can be carried by a roller 141. Accordingly, the apparatus 120 can include two rollers 141, shown as a first roller 141a (carrying the first contact surface 142a) and a second roller 141b (carrying the second contact surface 142b). The rollers 141 can be rotatably mounted to a roller mount 140, positioned proximate to the carrier 130. In one aspect of this embodiment, the first roller 141a rotates about a first rotation axis 143a, and the second roller 141b rotates about a second rotation axis 143b, different than the first rotation axis 143a. In a particular embodiment, each contact surface 142a, 142b is curved and concentric with the respective rotation axis 143a, 143b. In other embodiments, the contact surfaces 142 can have different arrangements. For example, the contact surfaces 142 can be carried by belts or treads that extend around a pair of support wheels. In any of these embodiments, the contact surfaces 142 can be positioned to engage the corners 105 of the PCB 100 while the PCB 100 is carried by the carrier 130. Accordingly, the contact surfaces 142 can include materials selected to withstand relatively high compressive forces. Such materials include hardened steel.

In one aspect of an embodiment shown in FIG. 2, the carrier 130 can include a contact portion 132 for releasably contacting the PCB 100. In one embodiment, the contact portion 132 includes two grippers 131, each of which engages an oppositely facing end surface 108a, 108b of the PCB 100. In a further aspect of this embodiment, the apparatus 120 can include an actuator system 125 having a motion actuator 121 coupled to the carrier 130 to move the PCB 100 relative to the contact surfaces 142. For example, the carrier 130 can move the PCB 100 relative to the roller mount 140 along a motion path 124 that is generally parallel with the corners 105. In another embodiment, described in greater detail below with reference to FIG. 6, the roller mount 140 can translate along the motion path 124 while the PCB 100 remains stationary. In still a further embodiment, the motion actuator 121 can translate the PCB 100 in one direction while the roller mount 140 translates in the opposite direction. In any of these embodiments, the rollers 141 need not be actively driven, but can rotate freely as a result of the relative motion between the PCB 100 and the contact surfaces 142. Accordingly, each roller 141 can rotate independently of the other, but will tend to rotate simultaneously with the other when both rollers 141 engage the PCB 100.

In another aspect of an embodiment shown in FIG. 2, the motion actuator 121 can also move the carrier 130 relative to a tray 123, which supports a plurality of the PCBs 100. Accordingly, the carrier 130 can operate in an automatic or semi-automatic manner to (1) pick an unshaped PCB 100 from the tray 123, (2) shape the PCB 100 by contacting it with the contact surfaces 142, and (3) return the shaped PCB 100 to the same or a different tray 123 after shaping. In other embodiments, the PCB 100 can be loaded, unloaded and/or moved manually.

In any of the foregoing embodiments, the edges 105 of the PCB 100 bear against the contact surfaces 142 as the PCB 100 and the contact surfaces 142 move relative to each other. Accordingly, the apparatus 120 can apply a force to the corners 105 in a direction generally normal to the motion path 124 as the PCB 100 bears against the contact surfaces 142. In one aspect of this embodiment, the roller mount 140 can be coupled to a normal force actuator 122a or other device to force the rollers 141 upwardly against the PCB 100 along a force axis 126. For example, in a particular aspect of this embodiment, the normal force actuator 122a can apply an upward force of about 20 pounds. In other embodiments, the normal force actuator 122a can apply forces having other values, depending on factors that include but are not limited to the composition and size of the PCB 100, and the orientation of the rotation axes 143.

In another embodiment, the carrier 130 can be coupled to a normal force actuator 122b or another device that forces the PCB 100 downwardly against the rollers 141. In still further embodiments, the normal force actuators 122a, 122b can be eliminated, for example, when the combined weight of the carrier 130 and the PCB 100 provides sufficient bearing force between the corners 105 and the contact surfaces 142.

Figure 3:
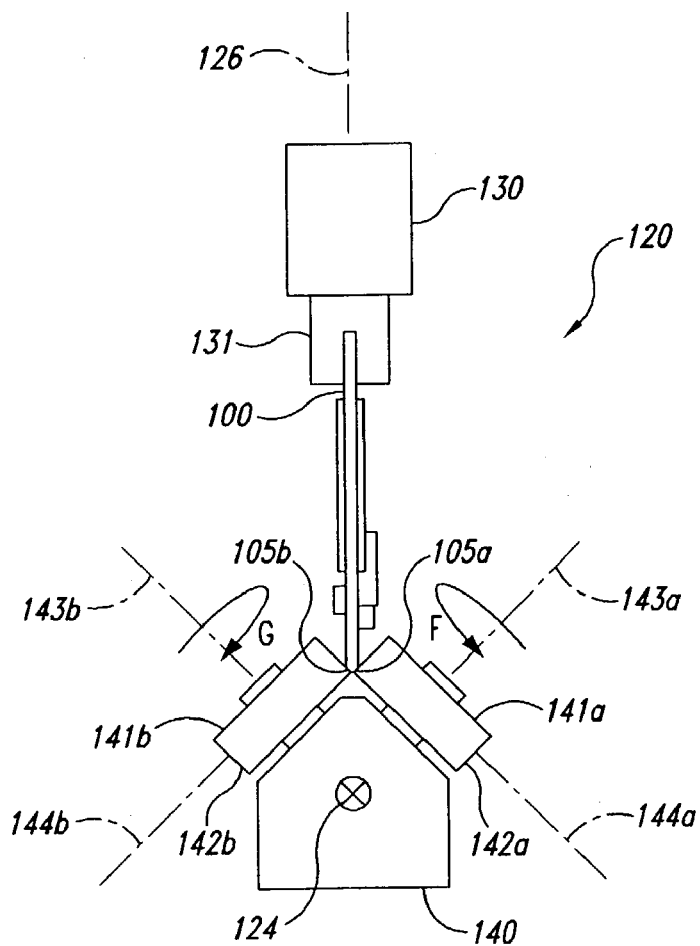
FIG. 3 is an end view of a portion of the apparatus shown in FIG. 2.

FIG. 3 is a partially schematic, end view of a portion of the apparatus 120 described above with reference to FIG. 2. As shown in FIG. 3, each contact surface 142a, 142b can contact a corresponding one of the printed circuit board corners 105a, 105b, respectively. As is also shown in FIG. 3, the first roller 141a can rotate about the first rotation axis 143a independently of the rotation of the second roller 141b about the second rotation axis 143b. For example, as the rollers 141 and the PCB 100 translate relative to each other along the motion axis 124, the first roller 141a can rotate counterclockwise about the first rotation axis 143a (as indicated by arrow F), and the second roller 141b can rotate clockwise about the second rotation axis 143b (as indicated by arrow G).

Figure 4:
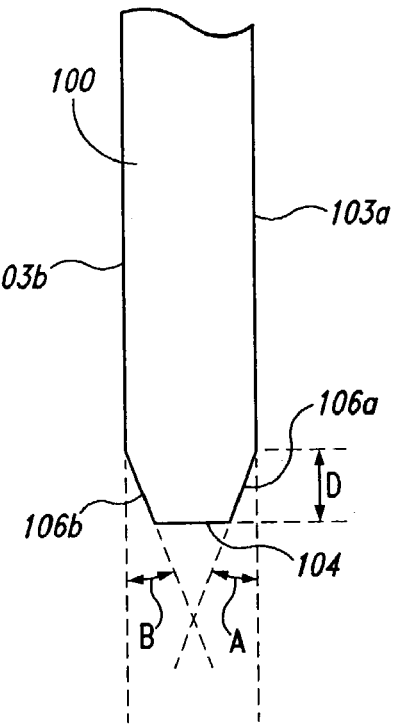
FIG. 4 is an end view of a PCB after having been shaped in accordance with an embodiment of the invention.

FIG. 4 is a partially schematic, end view of a portion of the PCB 100 after undergoing a shaping process in accordance with an embodiment of the invention. In one aspect of this embodiment, the PCB 100 can include beveled portions 106 (as shown as a first beveled portion 106a and a second beveled portion 106b). The beveled portions 106 can be symmetric with respect to each other so that a first angle A between the plane of the first beveled portion 106a and the first face 103a is at least approximately the same as a second angle B between the plane of the second beveled portion 106b and the second face 103b. In another embodiment, the first angle A can be different than the second angle B. In either embodiment, the first and second angles A, B can have values of from about 15 degrees to about 60 degrees. In a particular embodiment, the first and second angles A, B can have values of from about 20 degrees to about 45 degrees, and in a further particular embodiment, the first and second angles A, B can each have a value of about 30 degrees. In any of these embodiments, each beveled portion 106 can extend away from the intermediate surface 104 of the PCB 100 by a distance D. In one embodiment, the distance D can be from about 0.001 inch to about 0.020 inch, and in a particular embodiment, the distance D can vary from about 0.002 inch to about 0.010 inch. In any of these embodiments, the beveled portions 106 can include conductive materials, non-conductive materials, or both conductive and non-conductive materials of the PCB 100.

One feature of an embodiment of the apparatus 120 described above with reference to FIGS. 2 and 3 is that the first contact surface 142a rotates about a different rotation axis than does the second contact surface 142b as the apparatus 120 shapes the corners 105 of the PCB 100. For example, in a particular aspect of this embodiment, a first line 144a (FIG. 3) extending at least approximately perpendicularly to the first contact surface 142a and the surface of the first beveled portion 106a is also at least approximately perpendicular to the first rotation axis 143a. A second line 144b (FIG. 3) extending at least approximately perpendicularly to the second contact surface 142b and the surface of the second beveled portion 106b is also at least approximately perpendicular to the second rotation axis 143b. Viewed in another manner, the rotation axis 143 for each contact surface 142 can be generally parallel to at least a portion of the contact surface 142 and to at least a portion of the plane of the corresponding beveled portion 106. As a result, the force applied by each contact surface 142 to the respective corner 105 can have a reduced tangential component when compared with other methods for beveling PCB corners.

An advantage of the foregoing feature is that the contact surfaces 142 are less likely to strip material from the PCB 100 or cause layers of the PCB 100 to delaminate. For example, embodiments of the apparatus 120 can be less likely than existing apparatuses to damage the tie bars 113 (FIG. 1) of the PCB 100 during the beveling process. Accordingly, PCBs 100 shaped with embodiments of the apparatuses and methods described above can be more likely to have uniformly beveled corners 105. As a result, the PCBs 100 can be more smoothly and reliably received by the sockets 115 (FIG. 1).

In other embodiments, the apparatus 120 described above can have other arrangements. For example, the apparatus 120 can include a single contact surface 142 that rotates about a single rotation axis 143 to bevel or otherwise shape one corner 105. In one aspect of this embodiment, the opposite corner can be supported with a block or other structure to prevent or at least restrict the PCB 100 from bending while the contact surface 142 engages the corner 105. Such an arrangement can be suitable when beveling a single corner 105 of the PCB 100 provides the desired ease of insertion as the PCB 100 is received in the socket 115 (FIG. 1). An advantage of this arrangement is that the apparatus can be simplified because the number of contact surfaces 142 can be reduced.

Figure 5A:
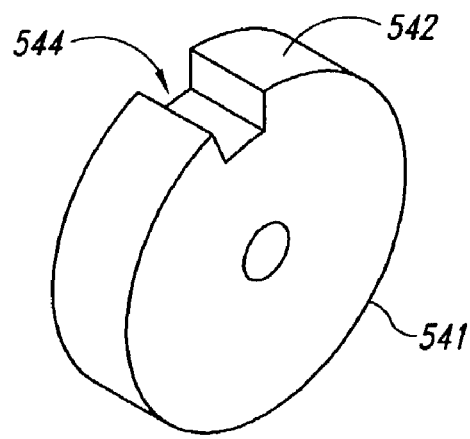
FIG. 5A is an isometric illustration of a roller having a recess in accordance with an embodiment of the invention.
Figure 5B:
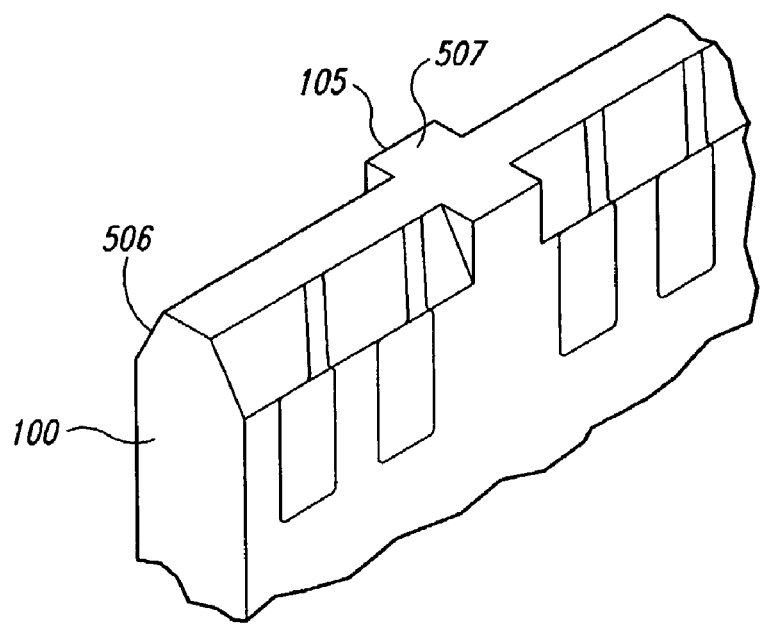
FIG. 5B is an isometric illustration of a portion of a PCB after having been shaped with the roller shown in FIG. 5A.

In other embodiments, the apparatus 120 described above can have still further arrangements. For example, FIG. 5A illustrates a roller 541 (suitable for use with embodiments of the apparatus 120 described above) having a contact surface 542 with a recess 544 or other discontinuity. FIG. 5B illustrates a portion of a PCB 100 having corners 105 shaped by two rollers 541 generally similar to the one shown in FIG. 5A. Referring to FIGS. 5A and 5B together, the roller 541 can shape different portions of the PCB corner 105 in different manners. In a particular embodiment, the roller 541 can provide a beveled portion 506 where the contact surface 542 engages the corner 105, and an unbeveled portion 507 where the recess 544 aligns with the corner 105. In other embodiments, the roller 541 can have other discontinuous contact surfaces 542 and/or other patterns and/or arrangements of recesses 544.

In any of the foregoing embodiments, the unbeveled portion 507 can be used to align the PCB 100 when the PCB is inserted into a corresponding socket. For example (referring now to FIG. 1), the PCB 100 can include a plurality of contact arrays 110 separated by a contactless portion 114, and the socket 115 can include a corresponding plurality of contact receptacles 116 separated by a gap 117. An embodiment of the roller 541 described above with reference to FIG. 5A can bevel the contact arrays 110 and leave the contactless portion 114 unbeveled. The contact receptacles 116 can be shaped to selectively receive the beveled contact arrays 110, and the gap 117 can be shaped to selectively receive the unbeveled contactless portion 114. Accordingly, the PCB 100 will seat properly only when the contact arrays 110 are aligned with the corresponding contact receptacles 116, and the contactless portion 114 is properly aligned with the gap 117. In other embodiments, the roller 541 can be configured to provide other beveled and/or unbeveled patterns on the PCB 100. For example, the roller 541 can include a plurality of recesses to provide an unbeveled portion between each contact 111 of the contact arrays 110. In still another embodiment, the contact surface 542 can be convex (e.g., crowned) or concave, or can have other cross-sectional shapes.

Figure 6A:
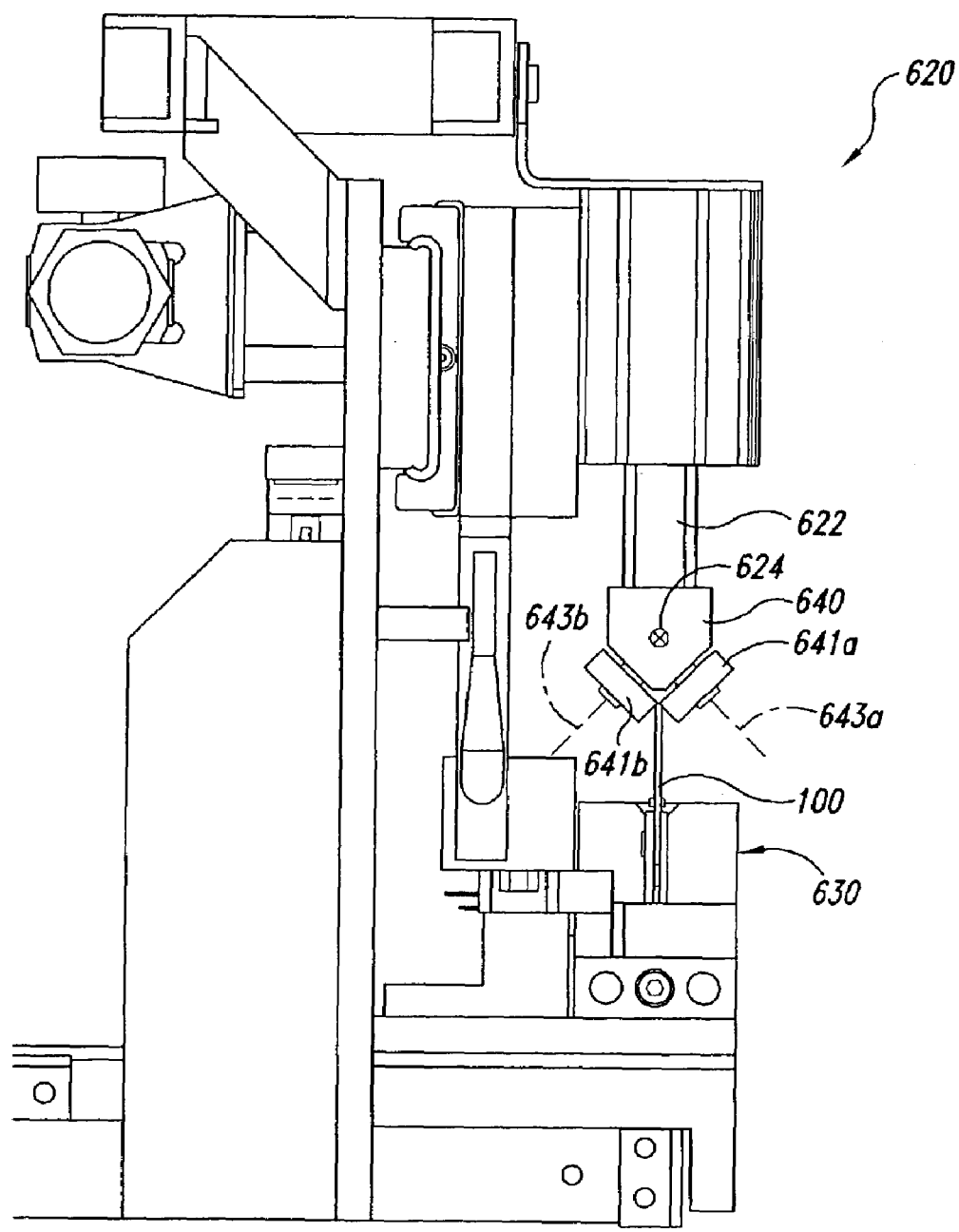
FIG. 6A is an end view of an apparatus configured to shape a PCB in accordance with another embodiment of the invention.
Figure 6B:
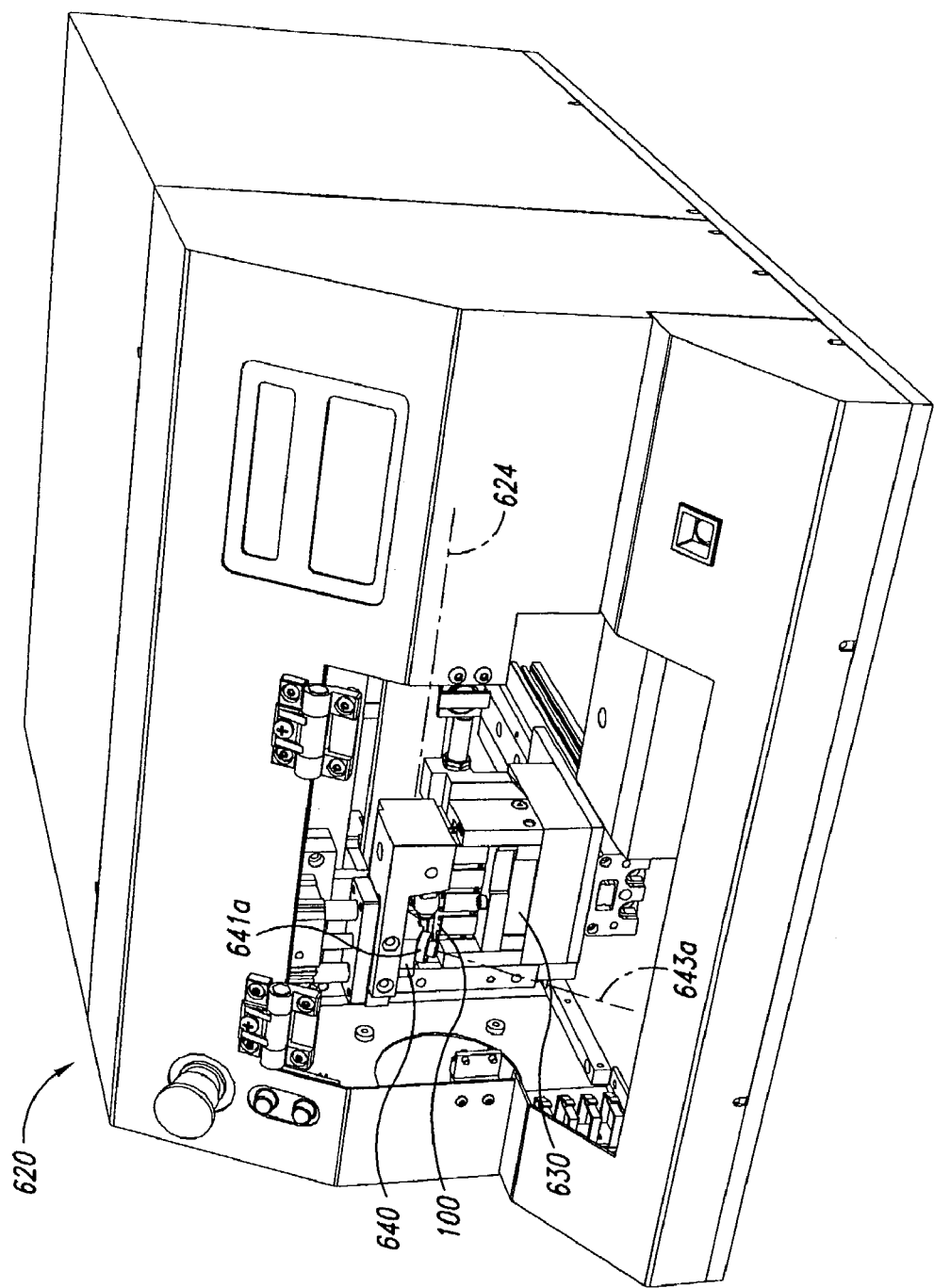
FIG. 6B is an isometric view of an embodiment of the apparatus shown in FIG. 6A.

FIG. 6A is a partially schematic end view of an apparatus 620 configured to shape the edges of the PCB 100 in accordance with another embodiment of the invention. FIG. 6B is an isometric view of an embodiment of the apparatus 620. In one aspect of the embodiment shown in FIGS. 6A–6B, the apparatus 620 includes a carrier 630 configured to support the PCB 100, and a roller mount 640 configured to support rollers 641*a*, 641*b*. In a particular aspect of this embodiment, the carrier 630 is positioned below the roller mount 640. In another aspect of this embodiment, the carrier 630 can be manually loaded with the PCB 100. In still a further aspect of this embodiment, the roller mount 640 can translate along a motion path 624 relative to the PCB 100. The first and second rollers 641*a*, 641*b* can rotate about different rotation axes 643*a*, 643*b* in a manner generally similar to that described above with reference to FIGS. 2 and 3. Accordingly, embodiments of the apparatus 620 described above with reference to FIGS. 6A–6B can provide shaped PCB corners having characteristics generally similar to those described above with reference to FIGS. 2–5B.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. An apparatus for shaping a corner of a printed circuit board, comprising:
    a carrier having at least one contact portion positioned to releasably contact a printed circuit board; and
    at least one curved contact surface positioned at least proximate to the carrier, the at least one contact surface being rotatable relative to the carrier about a rotation axis to roll against a corner of the printed circuit board when the carrier carries the printed circuit board, the rotation axis being generally parallel to at least a portion of the at least one curved contact surface.

2. The apparatus of claim 1 wherein the at least one curved contact surface includes a curved first contact surface rotatable about a first rotation axis to roll against a first corner of the printed circuit board, and wherein the apparatus further comprises a curved second contact surface positioned at least proximate to the carrier, the second contact surface being rotatable relative to the carrier about a second rotation axis different than the first rotation axis, and being positioned to roll against a second corner of the printed circuit board when the carrier carries the printed circuit board.

3. The apparatus of claim 1 wherein a line extending at least approximately perpendicular to the at least one contact surface is at least approximately perpendicular to the rotation axis.

4. The apparatus of claim 1 wherein the at least one contact surface forms a portion of a roller, the roller being rotatable about the rotation axis.

5. An apparatus for shaping a corner of a printed circuit board, comprising:
    a carrier having at least one contact portion positioned to releasably contact a printed circuit board;
    a curved first contact surface positioned at least proximate to the carrier, the first contact surface being rotatable relative to the carrier about a first rotation axis to roll against a first corner of the printed circuit board when the carrier carries the printed circuit board; and
    a curved second contact surface positioned at least proximate to the carrier, the second contact surface being rotatable relative to the carrier about a second rotation axis different than the first rotation axis, and being positioned to roll against a second corner of the printed circuit board when the carrier carries the printed circuit board.

6. The apparatus of claim 5 wherein a first line extending at least approximately perpendicular to the first contact surface is at least approximately perpendicular to the first rotation axis, and wherein a second line extending at least approximately perpendicular to the second contact surface is at least approximately perpendicular to the second rotation axis.

7. The apparatus of claim 5 wherein the first contact surface forms a portion of a first roller, the first roller being rotatable about the first rotation axis, and wherein the second contact surface forms a portion of a second roller, the second roller being rotatable about the second rotation axis.

8. The apparatus of claim 5 wherein the first contact surface is generally continuous.

9. The apparatus of claim 5 wherein the first contact surface is discontinuous.

10. The apparatus of claim 5 wherein the first contact surface is positioned to bevel the first corner of the printed circuit board and wherein the second contact surface is positioned to bevel the second corner of the printed circuit board.

11. The apparatus of claim 5 wherein the first contact surface includes at least one recess.

12. The apparatus of claim 5 wherein the first and second contact surfaces form a contact surface pair and wherein at least one of the carrier and the contact surface pair is coupled to a forcing device to force the at least one of the carrier and the contact surface pair toward the other.

13. The apparatus of claim 5 wherein the first and second contact surfaces forms a contact surface pair, and wherein at least one of the carrier and the contact surface pair is movable relative to the other along a motion axis extending between the first and second rotation axes.

14. The apparatus of claim 5 wherein the first contact surface is rotatable independent of the second contact surface.

15. The apparatus of claim 5 wherein the printed circuit board includes a first face adjacent to the first corner and a second face adjacent to the second corner, with the first and second faces facing in opposite directions, and wherein the first and second rotation axes are symmetric with respect to a reference plane located between and parallel to the first and second faces.

16. The apparatus of claim 5 wherein the first and second corners of the printed circuit board face in opposite directions and wherein the first contact surface is positioned to roll against the first corner simultaneously with the second contact surface rolling against the second corner.

17. An apparatus for shaping a corner of a printed circuit board, comprising:
    a carrier having at least one gripper positioned to releasably grip a printed circuit board;
    a roller mount positioned at least proximate to the carrier;
    a first roller rotatably coupled to the roller mount, the first roller being rotatable about a first rotation axis and having a curved first contact surface positioned to roll against a first corner of the printed circuit board when the gripper releasably grips the printed circuit board;
    a second roller coupled to the roller mount, the second roller being rotatable about a second rotation axis different than the first rotation axis, the second roller having a curved second contact surface positioned to roll against a second corner of the printed circuit board; and
    an actuator system coupled to at least one of the carrier and the roller mount to move the at least one of the carrier and the roller mount while the carrier supports the printed circuit board in contact with the first and second rollers.

18. The apparatus of claim 17 wherein the actuator system includes a first actuator portion positioned to move the at least one of the carrier and the roller mount relative to the other, and wherein the apparatus further comprises a second actuator portion operatively coupled to at least one of the carrier and the roller mount to force the at least one of the carrier and the roller mount toward the other along a force axis extending between the first and second rotation axes.

19. The apparatus of claim 17 wherein the first contact surface is positioned to bevel the first corner of the printed circuit board and wherein the second contact surface is positioned to bevel the second corner of the printed circuit board.

20. The apparatus of claim 17 wherein the first contact surface includes at least one recess.

21. An apparatus for shaping a corner of a printed circuit board, comprising:
   carrier means for releasably carrying a printed circuit board;
   curved first contact surface means for rolling against a first corner of the printed circuit board when the carrier means carries the printed circuit board, the first contact surface means being rotatable relative to the carrier means about a first rotation axis; and
   curved second contact surface means for rolling against a second corner of the printed circuit board when the carrier means carries the printed circuit board, the second contact surface means being rotatable relative to the carrier means about a second rotation axis different than the first rotation axis.

22. The apparatus of claim 21 wherein the first contact surface means forms a portion of a first roller, the first roller being rotatable about the first rotation axis, and wherein the second contact surface means forms a portion of a second roller, the second roller being rotatable about the second rotation axis.

23. The apparatus of claim 21 wherein the first contact surface means is generally continuous.

24. The apparatus of claim 21 wherein the first contact surface means includes at least one recess.

25. The apparatus of claim 21 wherein the first contact surface means is rotatable independent of the second contact surface means.

26. The apparatus of claim 21 wherein the printed circuit board includes a first face adjacent to the first corner and a second face adjacent to the second corner, with the first and second faces facing in opposite directions, and wherein the first and second rotation axes are symmetric with respect to a reference plane located between and parallel to the first and second faces.

* * * * *